(12) United States Patent
Sasaki

(10) Patent No.: US 6,214,130 B1
(45) Date of Patent: Apr. 10, 2001

(54) METHOD FOR CLEANING THE INSIDE OF A PIPE IN SEMICONDUCTOR DEVICE FABRICATING MACHINE

(75) Inventor: Yasushi Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/323,280

(22) Filed: Jun. 1, 1999

(30) Foreign Application Priority Data

May 29, 1998 (JP) .................................................. 10-148728

(51) Int. Cl.$^7$ .................................. B08B 7/00; B08B 9/02
(52) U.S. Cl. .......................... 134/19; 134/1.2; 134/22.11; 134/37
(58) Field of Search .................................. 134/19, 21, 35, 134/37, 1.1, 1.2, 1.3, 22.11, 22.12

(56) References Cited

U.S. PATENT DOCUMENTS

| | | | |
|---|---|---|---|
| 4,654,088 | 3/1987 | Fitzpatrick et al. | 134/18 |
| 5,445,679 | * 8/1995 | Hansen et al. | 134/1 |
| 6,003,526 | * 12/1999 | Lo et al. | 134/1.1 |

FOREIGN PATENT DOCUMENTS

| | | |
|---|---|---|
| 56-021333 | 2/1981 | (JP) . |
| 4-145991 | 5/1992 | (JP) . |
| 4-192330 | 7/1992 | (JP) . |
| 5-144802 | 6/1993 | (JP) . |

* cited by examiner

*Primary Examiner*—Randy Gulakowski
*Assistant Examiner*—Saeed Chaudhry
(74) *Attorney, Agent, or Firm*—Young & Thompson

(57) ABSTRACT

In a method for cleaning up an inner wall surface of a pipe of a semiconductor device fabricating machine, the pipe is heated while supplying a cleaning gas obtained by adding 1% to 5% of $O_2$ gas to a high-purity Ar, into the pipe. Since Ar having a large molecular size is used, the organic matters within the pipe are expelled and blown away by Ar, and then, are discharged together with the cleaning gas to the outside of the pipe. In addition, since the organic matters are burnt by the added 1% to 5% of $O_2$ within the pipe being heated, the organic matters are converted into CO, $CO_2$ and $H_2O$, which are discharged together with the cleaning gas to the outside of the pipe. As a result, the organic matters within the pipe can effectively removed.

9 Claims, 1 Drawing Sheet

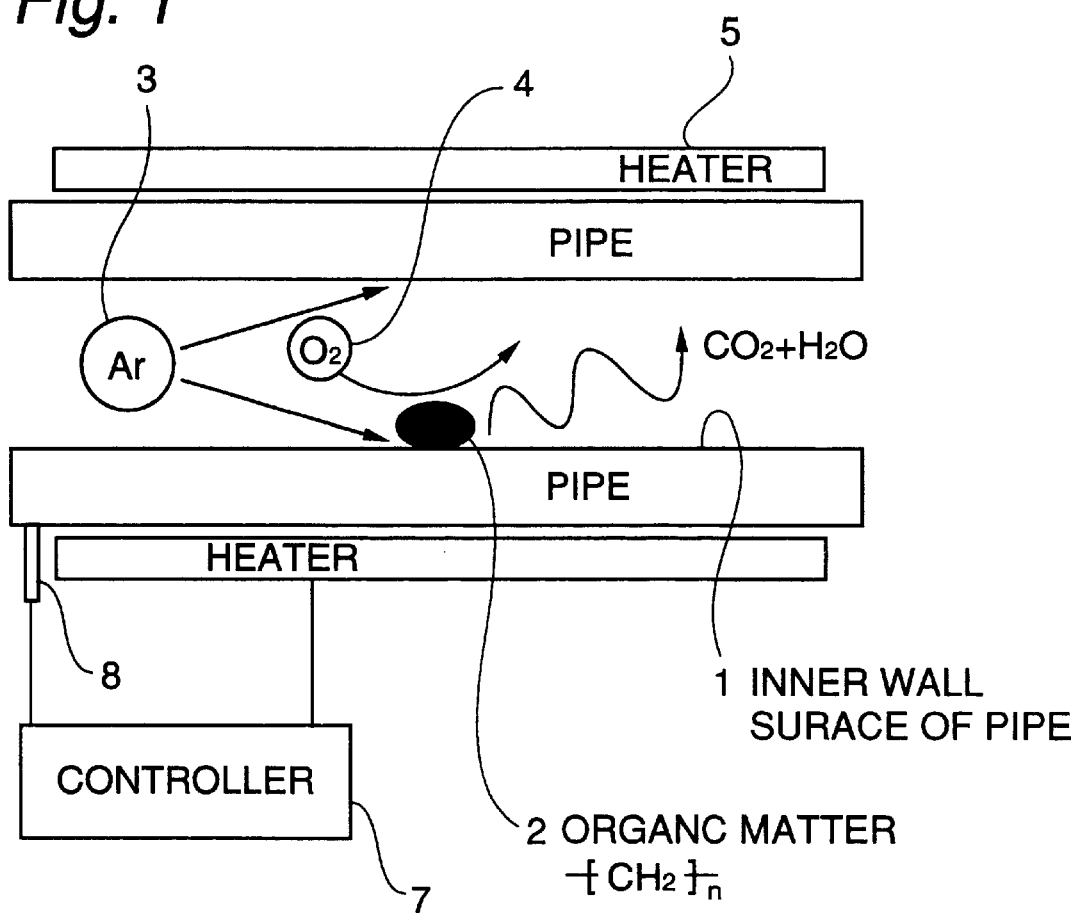

METHOD FOR CLEANING THE INSIDE OF A PIPE IN SEMICONDUCTOR DEVICE FABRICATING MACHINE

BACKGROUND OF THE INVENTION

1. Field of the invention

The present invention relates to a method for cleaning the inside of a pipe in a semiconductor device fabricating machine, and more specifically to a method for removing an organic matter adhered on an inner wall surface of a gas piping parts such as a pipe and a joint in a semiconductor device fabricating machine.

2. Description of related art

In a DRAM (dynamic random access memory) which is one kind of semiconductor devices, the area of a memory cell has a tendency to reduce more and more in order to meet with a demand for an elevated integration density. If the area of the memory cell reduces, the amount of charge stored in the memory cell reduces correspondingly. As a result, it is becoming difficult not only to realize the elevated integration density but also to ensure a required amount of charge stored in the memory cell. Under this circumstance, in order to ensure a required amount of charge in the memory cell having a reduced cell area, it has been proposed to grow hemispherical grains on a surface of a capacitor electrode of a stacked capacitor by a HSG (hemi-spherical grain) technology so as to cause the capacitor electrode to have an increased effective surface area.

In a processing for growing the hemi-spherical grains in the HSG technology, there occurred a situation that the hemi-spherical grains abnormally grew with the result that an expected increased surface area of the capacitor electrode could not be realized. The inventor studied the cause of this problem, and found out that the cause is an abnormal growth of organic matters in an atmosphere before the hemi-spherical grains is grown or in the growing process of the hemi-spherical grains. The organic matters in an atmosphere result from the peeling-off of the organic matters adhered to an inner wall of a pipe, particularly, the peeling-off of organic matters adhered to an inner wall of a piping parts such as a pipe and a joint from a packing vinyl envelope. In other words, it has become severely required to have a high degree of purity concerning the organic matters in the piping parts. In the following, the term "pipe" will be used to include a piping parts other than the pipe, for example, a joint.

In the prior art, the inside of the pipe was cleaned up by using a relatively inexpensive high-purity $N_2$ as a cleaning gas. However, occurrence of the above mentioned problem means that this prior art method for cleaning the inside of the pipe is no longer satisfactory.

One example of the method for cleaning up the inside of the pipe by use of $N_2$, is disclosed in Japanese Patent Application Pre-examination Publication No. JP-A-04-145991 (an English abstract of JP-A-04-145991 is available and the content of the English abstract is incorporated by reference in its entirety into this application). In this prior art method, the inside of the pipe is cleaned up by alternately repeating a supplying of a liquid nitrogen into the pipe and a gas purging for the pipe.

The liquid nitrogen supplied from one end of the pipe into the inside of the pipe absorbs heat from the pipe or the outside of the pipe so that the liquid nitrogen is vaporized and therefore becomes a nitrogen gas. In this process, because of a cooling effect by the temperature of the liquid nitrogen itself having a boiling temperature of −197° C. and because of a boiling of the liquid nitrogen, contaminant adhered to the inside of the pipe is peeled off and removed away. In the case of an organic micro-contaminant, the cooling effect causes the organic contaminant to contract so that an adhering force of the organic contaminant drops because of a difference in thermal expansion coefficient between the organic contaminant and a material of the pipe. On the other hand, the boiling of the liquid nitrogen peels off the organic contaminant adhered to the inside of the pipe by its physical action.

However, this prior art method for cleaning up the inside of the pipe, was insufficient in removing the organic matters, as mentioned hereinbefore. In addition, the boiling of the liquid nitrogen within the pipe is dangerous because a high pressure suddenly acts within the pipe.

Japanese Patent Application Pre-examination Publication No. JP-A-05-144802 (an English abstract of JP-A05-144802 is available and the content of the English abstract is incorporated by reference in its entirety into this application) points out that, in a method for cleaning up a heattreating pipe of an oxidation oven by baking the heat-treating pipe while supplying an inert gas such as $N_2$ into the heat-treating pipe, there is a problem of an insufficient cleaning in that particles such as Na, Fe and Cu remain on an inner wall surface of the heat-treating pipe. In order to overcome this problem, JP-A05-144802 discloses a cleaning method of baking the heat-treating pipe by using a clearing gas which is the same as a processing gas.

In this prior art method, accordingly, when the semiconductor device fabricating machine having the heat-treating pipe is the oxidation oven, if an $O_2$ gas is used as the process gas, the $O_2$ gas is used as a cleaning gas. At this case, if a mixed gas composed of an $O_2$ gas and an Ar gas is used in place of the $O_2$ gas as the process gas, the mixed gas of the $O_2$ gas and the Ar gas is used as the cleaning gas. Of course, in this oxidation treatment, the percentage of the $O_2$ gas is high in the mixed gas of the $O_2$ gas and the Ar gas. When the semiconductor device fabricating machine having the heat-treating pipe is a CVD (chemical vapor deposition) chamber, if a silane gas is used as the process gas, the silane gas is used as the cleaning gas. When the semiconductor device fabricating machine having the heat-treating pipe is an annealing oven, if an $N_2$ gas is used as the process gas, the $N_2$ gas is used as the cleaning gas.

The reason for using the cleaning gas which is the same as the process gas when the heat-treating pipe is baked, is that, whatever cleaning gas is used, only the contaminating particles of the limited kinds corresponding to the kind of the cleaning gas can be removed. Namely, all kinds of contaminating particles cannot be removed. Accordingly, if the cleaning is carried out by using the same gas as the process gas, it is possible to remove only the contaminating particles that can be removed by the cleaning gas. However, since the process gas which is the same as the cleaning gas is used in a succeeding process, no contaminating particles that can be removed by the process gas exists in the heat-treating pipe, so that no contaminating particles is conveyed to the semiconductor device fabricating machine by the process gas, and therefore, the processing can be carried out in a cleaned condition.

As mentioned above, this prior art method cannot completely remove all the kinds of inorganic contaminating particles such as Na, Fe and Cu, but is intended to remove only the removable contaminating particles since the semiconductor device fabricating machine is not contaminated by the contaminating particles that cannot be removed. In other words, this prior art method is not intended to remove organic contaminating particles, nor can it remove the organic contaminating particles.

Thus, in the prior art, there is no practical method for cleaning up the inside of the pipe, which can remove the organic matters adhered to the inside of the pipe in order to clean up the inside of the pipe to a high degree of cleanness so that the hemispherical grains can be grown by the HSG technology with causing no abnormal growth.

SUMMARY OF THE INVENTION

Accordingly, it is an object of the present invention to provide a method for cleaning up the inside of the pipe, which has overcome the above mentioned problem of the prior art.

Another object of the present invention is to provide a pipe inside cleaning method for removing an organic matter adhered on an inner wall surface of the pipe of the semiconductor device fabricating machine, to a high degree of cleanness.

The above and other objects of the present invention are achieved in accordance with the present invention by a method for cleaning up an inner wall surface of a pipe of a semiconductor device fabricating machine, wherein the pipe is heated while supplying a cleaning gas obtained by adding 1% to 5% of $O_2$ gas to a high-purity Ar, into the pipe, thereby to effectively remove an organic matter in the inside of the pipe.

Preferably, the pipe is heated to a predetermined high temperature by elevating the temperature at an extremely low temperature elevation rate as a whole, for example, from the room temperature to 200° C. for at least three hours. More preferably, the temperature of the pipe is elevated while changing the temperature elevation rate step by step. In this case, the temperature may or may not be maintained at the predetermined high temperature for a substantial period of time.

As mentioned hereinbefore, the relatively inexpensive high-purity $N_2$ gas was ordinarily used as the cleaning gas in the prior art. $N_2$ is small in a gas molecular size and was used as the cleaning gas for mainly removing moisture. In the present invention, on the other hand, by using Ar which is larger in molecular size than $N_2$, it is possible to hit away the organic matters within the pipe by Ar, so that the organic matters are discharged together with the cleaning gas to the outside of the pipe. Furthermore, since 1% to 5% of $O_2$ is added, the organic matters are burnt within the pipe being heated, so that the organic matters become CO, $CO_2$ and $H_2O$, which will be discharged together with the cleaning gas to the outside of the pipe. As a result, the organic matters can be removed more effectively than the $N_2$ gas. Accordingly, not only the moisture within the pipe can removed but also the organic matters within the pipe can effectively removed by Ar and by a burning reaction.

In the prior art pipe heating method, in order to expel impurity such as moisture within the pipe, the temperature of the pipe is continuously elevated at a relatively high constant temperature elevation rate, and after the temperature reaches a predetermined high temperature, the predetermined high temperature is maintained for a predetermined period of time (for example, several hours). If this prior art pipe heating method is applied to the present invention, there is a risk that the organic matters become scorched and stuck on an inner surface of the pipe. However, if the temperature of the pipe is elevated to a predetermined high temperature at a low temperature elevation rate as a whole, preferably while changing the temperature elevation rate step by step, it is possible to avoid an abruptly burning of the organic matters within the pipe, with the result that the scorching and sticking of the organic matters can be prevented. Thus, all of the organic matters can be converted into CO, $CO_2$ and $H_2O$, which can be discharged together with the cleaning gas to the outside of the pipe.

The above and other objects, features and advantages of the present invention will be apparent from the following description of preferred embodiments of the invention with reference to the accompanying drawings.

BRIEF DESCRIPTION OF THE DRAWINGS

FIG. 1 is a diagrammatic sectional view of a pipe for illustrating the method in accordance with the present invention for cleaning the inside of the pipe in a semiconductor device fabricating machine.

DESCRIPTION OF THE PREFERRED EMBODIMENTS

Now, the present invention will be described with reference to the accompanying drawing.

Referring to FIG. 1, there is shown a diagrammatic sectional view of a pipe for illustrating the method in accordance with the present invention for cleaning the inside of the pipe in a semiconductor device fabricating machine. If the pipe of the semiconductor device fabricating machine is heated while supplying the pipe with a cleaning gas composed by adding 1% to 5% of $O_2$ into a high-purity Ar, as shown in FIG. 1, an organic matter 2 adhered to an inner wall surface 1 of the pipe is continuously hit by Ar molecules 3, with the result that the organic matter 2 is blown off. In addition, if the organic matter 2 is a combustible organic matter such as polyethylene (polymer of $C_2H_2$ group), since the pipe is heated to a high temperature, the organic matter 2 is burnt by 1% to 5% of $O_2$ included in the cleaning gas containing the high-purity Ar as a major component, so that the organic matter 2 becomes CO, $CO_2$ and $H_2O$, which are discharged together with the cleaning gas to the outside of the pipe.

Incidentally, the heating of the pipe is carried out by an electric heater 5 which surrounds the pipe and which is controlled by a controller 7. The controller 7 is connected to a temperature sensor 8 mounted to the pipe, and drives and controls the heater 5 to heat the pipe to a desired temperature.

First Embodiment

In order to remove organic matters adhered to an inner wall of a piping parts such as a pipe and a joint from a packing vinyl envelope, the present invention was carried out. A pipe of a semiconductor device fabricating machine was heated in the same heating pattern as that of the prior art heating method, while supplying the pipe with a cleaning gas obtained by adding 1% to 5% of $O_2$ into a high-purity Ar. This heating pattern is that the pipe was heated to a predetermined high temperature of not less than 200° C. with a relatively high temperature elevation rate such as 10° C./minute to 20° C./minute, and after the temperature of the pipe reached the predetermined high temperature, the pipe was maintained at the predetermined high temperature for a few hours (at least more than one hour).

In this embodiment, when the organic matters adhered to the inner wall of the pipe are extremely small, almost 100% of the organic matters could be removed. The reason for this is considered that the organic matters within the pipe are expelled and blown away by Ar having a large molecular size, and on the other hand, even if the extremely small organic matters are abruptly burnt, all of the extremely small organic matters are converted into gas such as CO, $CO_2$ and $H_2O$, without causing the scorching and sticking of the organic matters, so that CO, $CO_2$ and $H_2O$, are discharged together with the cleaning gas to the outside of the pipe. In addition, since the cleaning gas is high in purity and has no impurity other than Ar and $O_2$, the product of burning other than the gas is not generated.

Second Embodiment

A pipe of a semiconductor device fabricating machine was heated in the following heating pattern, while supplying the pipe with a cleaning gas obtained by adding 1% to 5% of $O_2$ into a high-purity Ar. This heating pattern is that the pipe was heated while changing the temperature elevation rate step by step in such a manner that the temperature was elevated from the room temperature to 50° C. for one hour to two hours, and from 50° C. to 100° C. for one hour to two hours, and then, from 100° C. to 200° C. for one hour to two hours. In this embodiment, almost 100% of the organic matters could be removed, regardless of the size of the organic matters adhered to the inner wall of the pipe.

The reason for this is considered that, since the pipe is heated to a predetermined high temperature at an extremely low temperature elevation rate as a whole, the organic matters are never abruptly burnt, so that, organic matters that can be decomposed with heat will be gradually decomposed with heat regardless of the size of the organic matters. On the other hand, organic matters that can be burnt with $O_2$ will be gradually burnt, so that all of the adhered organic matters are converted into gas such as CO, $CO_2$ and $H_2O$, which are discharged together with the cleaning gas to the outside of the pipe.

As mentioned above, according to the present invention, the pipe of the semiconductor device fabricating machine is heated while supplying the pipe with the cleaning gas obtained by adding 1% to 5% of $O_2$ into a high-purity Ar. By using Ar having a molecular size larger than that of $N_2$ which was used in the prior art, the organic matters within the pipe are expelled and blown away by Ar, and then, are discharged together with the cleaning gas to the outside of the pipe. In addition, since the organic matters within the pipe being heated cause a burning reaction with the 1% to 5% of $O_2$ added in the high-purity Ar, the organic matters are converted into CO, $CO_2$ and $H_2O$, which are discharged together with the cleaning gas to the outside of the pipe. As a result, at an efficiency higher than that in the $N_2$ gas, not only the moisture within the pipe can removed but also the organic matters within the pipe can effectively removed by the burning reaction.

The invention has thus been shown and described with reference to the specific embodiments. However, it should be noted that the present invention is in no way limited to the details of the illustrated structures but changes and modifications may be made within the scope of the appended claims.

What is claimed is:

1. A method for cleaning up an inner wall surface of a pipe of a semiconductor device fabricating machine, comprising the steps of supplying a cleaning gas obtained by adding 1% to 5% of $O_2$ gas to a high-purity Ar, into the pipe while heating the pipe by changing the temperature elevation rate step by step in such a manner that the temperature is elevated from room temperature to 50° C. for one hour to two hours, and from 50° C. to 100° C. for one hour to two hours, and then, from 100° C. to 200° C. for one hour to two hours, thereby to effectively remove organic matter from the inner wall surface of the pipe.

2. A method claimed in claim 1 wherein said semiconductor device fabricating machine is a processing machine for growing hemi-spherical grains.

3. A method claimed in claim 2 wherein said organic matter is combustible.

4. A method claimed in claim 1 wherein said organic matter is combustible.

5. A method for removing organic matter from an interior surface of a pipe in a semiconductor device fabricating machine, the method comprising the steps of:

decomposing the organic matter on the interior surface of the pipe by heating the pipe at an average rate of no more than about 1° C. per minute; and, while heating the pipe, conducting a cleaning gas through the pipe, the cleaning gas being a mixture of high purity argon gas and 1% to 5% oxygen gas.

6. The method of claim 5, wherein the pipe is heated to about 200° C.

7. The method of claim 5, wherein the heating takes place in stages during which the temperature of the pipe is increased to about 50° C. for one to two hours, to about 100° C. for a further one to two hours, and to about 200° C. for a further one to two hours.

8. A method claimed in claim 5 wherein said semiconductor device fabricating machine is a processing machine for growing hemi-spherical grains.

9. A method claimed in claim 8 wherein said organic matter is combustible.

* * * * *